US011106850B2

(12) United States Patent
Wolpert et al.

(10) Patent No.: US 11,106,850 B2
(45) Date of Patent: Aug. 31, 2021

(54) FLEXIBLE CONSTRAINT-BASED LOGIC CELL PLACEMENT

(71) Applicant: INTERNATIONAL BUSINESS MACHINES CORPORATION, Armonk, NY (US)

(72) Inventors: David Wolpert, Poughkeepsie, NY (US); Timothy A. Schell, Cary, NC (US); Erwin Behnen, Austin, TX (US); Leon Sigal, Monsey, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/559,976

(22) Filed: Sep. 4, 2019

(65) Prior Publication Data

US 2021/0064716 A1    Mar. 4, 2021

(51) Int. Cl.
*G06F 30/30* (2020.01)
*G06F 30/392* (2020.01)
*G06F 30/398* (2020.01)

(52) U.S. Cl.
CPC .......... *G06F 30/392* (2020.01); *G06F 30/398* (2020.01); *G06F 30/30* (2020.01)

(58) Field of Classification Search
None
See application file for complete search history.

(56) References Cited

U.S. PATENT DOCUMENTS

| | | | |
|---|---|---|---|
| 5,768,479 A | | 6/1998 | Gadelkarim et al. |
| 6,128,767 A | * | 10/2000 | Chapman ................ H01L 24/85 716/55 |
| 6,425,112 B1 | * | 7/2002 | Bula ........................ G03F 1/36 716/52 |

(Continued)

FOREIGN PATENT DOCUMENTS

WO    1996042060 A1    12/1996

OTHER PUBLICATIONS

J.-Y. Chueh et al., "Efficient standard cell abutment checker," 2013 IEEE, pp. 847-850. (Year: 2013).*

(Continued)

*Primary Examiner* — Leigh M Garbowski
(74) *Attorney, Agent, or Firm* — Cantor Colburn LLP; Margaret McNamara

(57) ABSTRACT

Methods, systems and computer program products for providing flexible constraint-based logic cell placement are provided. Aspects include determining a cell placement restriction rule that specifies an offset requirement between a first type of logic cell and a second type of logic cell. Responsive to placing a first cell that is the first type of logic cell within a semiconductor layout, aspects include tagging the first cell with the cell placement restriction rule. Aspects also include placing a second cell that is the second type of logic cell at an initial position within the semiconductor layout. Responsive to determining that the initial position of the second cell violates the cell placement restriction rule, aspects include repositioning the first cell or the second cell to a modified position within the semiconductor layout such that the modified position satisfies the cell placement restriction rule.

20 Claims, 8 Drawing Sheets

(56) References Cited

U.S. PATENT DOCUMENTS

| | | | | |
|---|---|---|---|---|
| 7,581,197 B2 * | 8/2009 | Arunachalam | ....... | G06F 30/392 716/119 |
| 7,669,160 B2 * | 2/2010 | Furnish | ................ | G06F 30/394 716/119 |
| 7,788,612 B2 * | 8/2010 | Chang | .................. | G06F 30/398 716/106 |
| 8,176,445 B1 * | 5/2012 | Qian | ....................... | G06F 30/39 716/52 |
| 8,448,097 B2 * | 5/2013 | Dai | ...................... | G06F 30/398 716/52 |
| 8,560,997 B1 | 10/2013 | Yang et al. | | |
| 8,661,393 B2 * | 2/2014 | Boone | ................. | G06F 30/392 716/122 |
| 8,806,390 B2 * | 8/2014 | Lippincott | ............... | G03F 1/36 716/53 |
| 8,949,203 B1 * | 2/2015 | O'Riordan | ......... | G06F 30/3323 707/694 |
| 9,530,795 B2 * | 12/2016 | Quandt | .................. | G06F 30/39 |
| 9,619,605 B1 * | 4/2017 | Kohli | ................... | G06F 30/392 |
| 10,216,890 B2 * | 2/2019 | Qian | ......................... | G03F 1/70 |
| 10,268,793 B2 * | 4/2019 | Lee | ....................... | G06F 30/392 |
| 2006/0271894 A1 | 11/2006 | Arunachalam | | |
| 2017/0116367 A1 * | 4/2017 | Bickford | ............... | G06F 30/392 |
| 2017/0177785 A1 * | 6/2017 | Lowe | ................... | G06F 30/398 |
| 2020/0042668 A1 * | 2/2020 | Peng | ........................ | G03F 1/36 |
| 2020/0125696 A1 * | 4/2020 | Chang | ...................... | G03F 1/36 |

OTHER PUBLICATIONS

Laurenco et al., "LAYGEN—Automatic Layout Generation of Analog ICs from Hierarchical Template Descriptions," 2006 Ph.D. Research in Microelectronics and Electronics, Otranto, 2006, pp. 213-216.

Masson et al., "Object Oriented Lisp Implementation of the CHEOPS VLSI Floor Planning and Routing System," 28th ACM/IEEE Design Automation Conference, Paper 17.2, 1991, pp. 259-264.

Transmittal Form PTO/SB/21 signed Mar. 17, 2020.

* cited by examiner

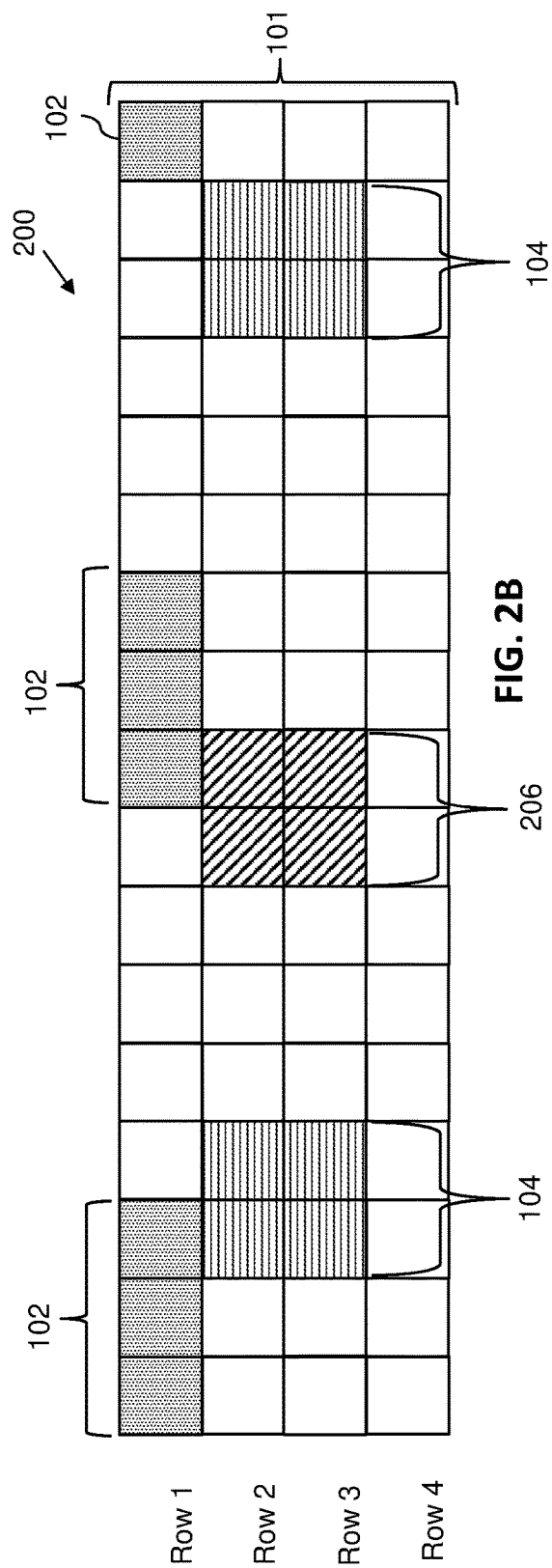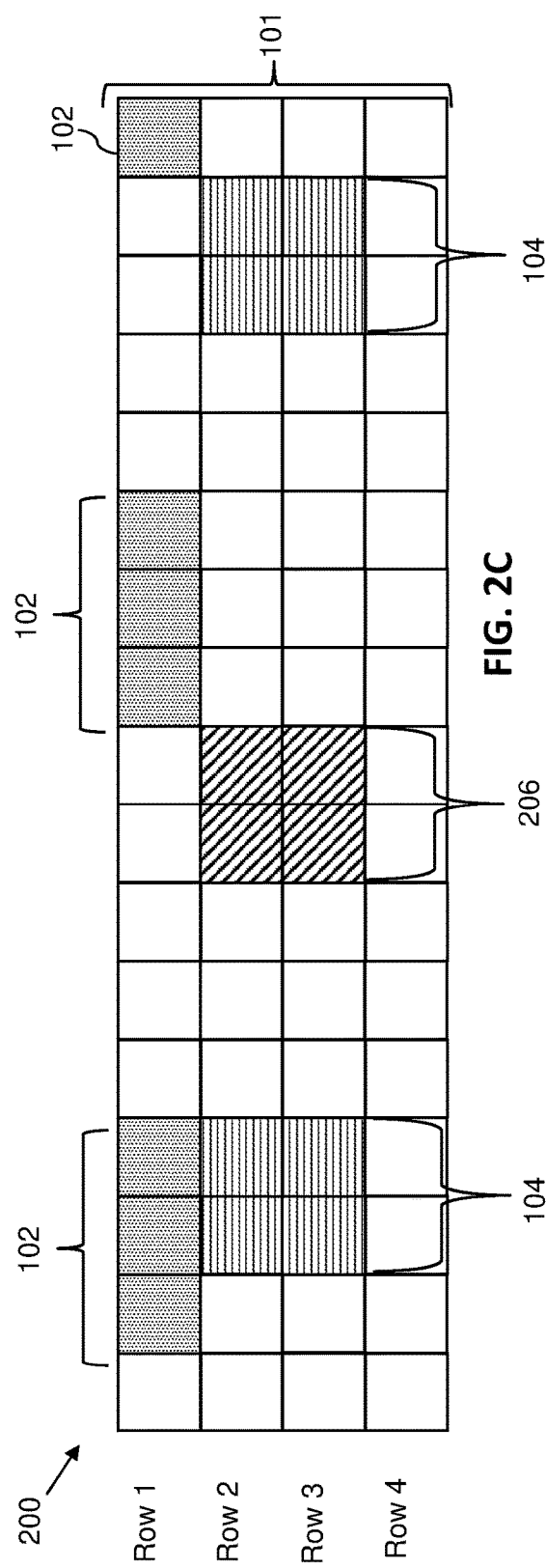

FLEXIBLE CONSTRAINT-BASED LOGIC CELL PLACEMENT

BACKGROUND

The present invention generally relates to methods and resulting structures for semiconductor devices, and more specifically, to flexible constraint-based logic cell placement.

The individual components of an integrated circuit (IC) are extremely small and its production demands precision at an atomic level. IC fabrication is a complex process during which electronic circuits are created in and on a wafer made out of very pure semiconducting material, typically silicon. The manufacturing is a multiple-step sequence which can be divided into two major processing stages, namely front-end-of-line (FEOL) processing and back-end-of-line (BEOL) processing. FEOL refers to the construction of the components of the IC directly inside the wafer. FEOL is the first portion of IC fabrication where the individual devices (such as transistors, capacitors, resistors, etc.) are patterned in the semiconductor. FEOL generally covers all steps up to the deposition of metal interconnect layers. FEOL contains all steps of CMOS fabrication needed to form fully isolated CMOS elements. The processes can include, but are not limited to, selecting the type of wafer to be used, chemical-mechanical planarization and cleaning of the wafer, shallow trench isolation (STI), transistor channel formation, gate module formation, and source and drain module formation.

SUMMARY

Embodiments of the present invention are directed to providing flexible constraint-based logic cell placement. A non-limiting example of the computer-implemented method includes determining a cell placement restriction rule that specifies an offset requirement between a first type of logic cell and a second type of logic cell. Responsive to placing a first cell that is the first type of logic cell within a semiconductor layout, the method includes tagging the first cell with the cell placement restriction rule. The method also includes placing a second cell that is the second type of logic cell at an initial position within the semiconductor layout. Responsive to determining that the initial position of the second cell violates the cell placement restriction rule, the method includes, repositioning the first cell or the second cell to a modified position within the semiconductor layout such that the modified position satisfies the cell placement restriction rule.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2B illustrates an example semiconductor layout with an initial placement of secondary logic cells device according to embodiments of the invention;

FIG. 2C illustrates an example semiconductor layout with modified placement of secondary logic cells device according to embodiments of the invention;

Figure 1:
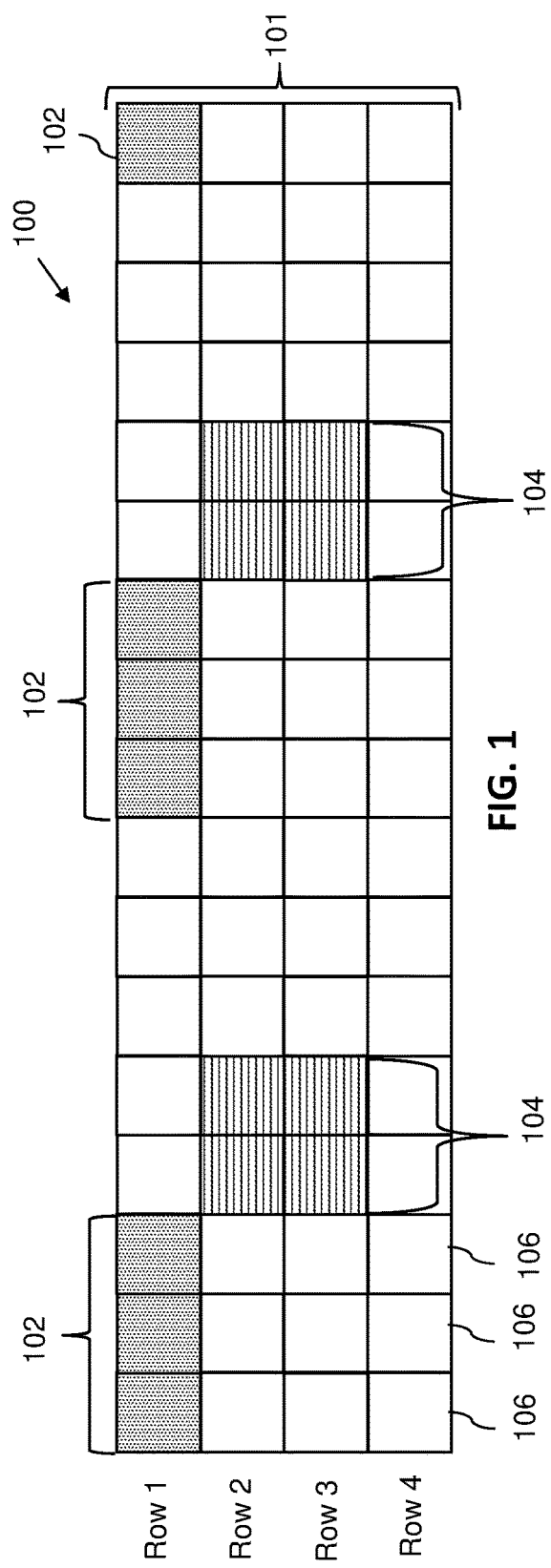
FIG. 1 illustrates an example semiconductor layout with regular placement of logic cells according to embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Very-large-scale integration (VLSI) is the process of creating an integrated circuit (IC) by combining billions of transistors into a single chip. Integrated circuit layout, also known as IC layout, IC mask layout, or mask design, is the representation of an integrated circuit in terms of planar geometric shapes which correspond to the patterns of metal, oxide, or semiconductor layers that make up the components of the integrated circuit. When using a standard process, where the interaction of the many chemical, thermal, and photographic variables is known and carefully controlled, the behavior of the final integrated circuit depends largely on the positions and interconnections of the geometric shapes. Using a computer-aided layout tool, the layout engineer or layout technician places and connects all of the components that make up the chip such that they meet certain criteria, typically performance, size, density, and manufacturability.

Design rule checking or check(s) (DRC) is the area of electronic design automation that determines whether the physical layout of a particular chip layout satisfies a series of recommended parameters called design rules. Design rule checking is a major step during physical verification signoff on the design. Design rules are a series of parameters provided by semiconductor manufacturers that enable the designer to verify the correctness of a mask set. Design rules are specific to a particular semiconductor manufacturing process. A design rule set specifies certain geometric and connectivity restrictions to ensure sufficient margins to account for variability in semiconductor manufacturing processes, so as to ensure that the parts work correctly. Two of the most basic design rules are a width rule that specifies the minimum width of any shape (e.g., the minimum width of a threshold voltage (VT) shape used to define device performance) in the design and a spacing rule that specifies the minimum distance between two adjacent shapes. These rules will exist for each layer of a semiconductor manufacturing process.

The main objective of design rule checking (DRC) is to achieve a high overall yield and reliability for the design. If design rules are violated, the design may not be functional. To meet this goal of improving die yields, DRC has evolved from simple measurement and Boolean checks, to more involved rules that modify existing features, insert new features, and check the entire design for process limitations such as layer density. A completed layout consists not only of the geometric representation (shape requirements) of the design, but also data that provides support for the manufacture of the design. While design rule checks do not validate that the design will operate correctly, they are constructed to verify that the structure meets the process constraints for a given design type and process technology (for fabrication).

DRC software can take as input a layout in the OASIS format (or the older GDSII standard format) and a list of rules specific to the semiconductor process chosen for fabrication. From these, DRC software produces a report of design rule violations that the designer may or may not choose to correct. Carefully "stretching" or waiving certain design rules is often used to increase performance and component density at the expense of yield. Some examples of DRCs in IC design include: active to active spacing, well to well spacing, the minimum channel length of the transistor, minimum metal width, metal to metal spacing, metal fill density (for processes using CMP), poly density, ESD and I/O rules, antenna effect, etc.

Turning now to an overview of technologies that are more specifically relevant to aspects of the invention, one or more algorithms for automated front-end-of-line shape merging cell placement and optimization for very-large-scale integration (VLSI) can be used to freely place standard cells with varying alignment periodicities, routing needs, and critical path locations in integrated circuits. Use of such an algorithm can result in the creation of a DRC compliant "brick wall" of cells that ensure that, for example, there are no 1 or 2 pitch gaps between threshold voltage (VT) shapes by filling gaps between active cells with fill cells such that all circuit rows are completely filled with cells after the initial placement of functional cells. In other words, an algorithm may initially place functional cells within a semiconductor layout and then "fill in" the spaces between the functional cells with fill cells. Functional cells are the cells (having many devices) that perform operations in the semiconductor device. The design shape is the type of functional cell, and functional cells can include high threshold voltage (HVT) regions, regular threshold voltage (RVT) regions, and low threshold voltage (LVT) regions. The functional cells include and/or operate as various logic blocks such as inverters, AND gates, OR gates, etc. Fill cells can be non-functional cells of appropriate threshold voltage to ensure design rule cleanliness (i.e., ensure the design rules are met even without being required to run the design rule check).

Conventionally, to avoid problematic placement of functional cells (which may also be referred to as "logic cells") relative to one another that may give rise to issues such as DRC failures, different functional cells are traditionally placed using a grid-based placement scheme that involves relative placement of different cell types based in predefined relative spatial increments. For example, a first type of functional cell may be placed once every 16 placement pitches and a second type of functional cell may be offset from the first type of logic cell by a specified number of placement pitches such that each instance of the second type of functional cell is placed relative to the instances of the first type of functional cell (e.g., the second type of functional cell may also be placed every 16 placement pitches but beginning at a position that is offset from the first type by 4 placement pitches). In this way, problematic placements can be avoided because a regular placement scheme ensures that no DRC issues will arise between different types of logic cells. However, such grid-based placement schemes lack placement flexibility, which can lead to inefficiencies in design, such as reduced cell density that can result in reduced performance due to the increased wire lengths needed to connect gates together. Further, reduced cell density increases the cost because fewer chips can fit on a wafer than if the space was otherwise more efficiently utilized.

Turning now to an overview of the aspects of the invention, one or more embodiments of the invention address one or more of the above-described shortcomings of the prior art and solve the problem of lack of placement flexibility by introducing a relative cell placement scheme in which cell combinations that are identified as causing one or more problems when placed in specific combinations of abutments and offsets are added to a list. Such problems could include design rule checking (DRC) failures, local heating issues, introduction of large local current draw that could cause local voltage drops/spikes/noise, and/or patterning problems that are generally detected using lithography checking tools (as opposed to DRC checking). According to embodiments of the present invention, such known issues can be considered to be constraints to be adhered to or avoided in providing an otherwise flexible placement of logic cells. When cells are placed, each cell is tagged with a property that defines which cells it has special placement restrictions against, and then specifies per cell, what the prohibited offsets are to that cell, essentially creating an "exclusion zone" around the cell that acts to repel or prevents the placement of other cells nearby that would give rise to DRC failures. For example, a given cell may be tagged with "Min_common_run=NAND2:VDD:40 nm", which can indicate that for every NAND2 cell on a VDD rail (i.e., sharing p-type field effect transistors [PFETs] on a shared nwell connected to a given voltage supply rail), the new cell being placed must be offset from the tagged cell by at least 40 nm. Thus, the placement restriction can be relative to the type of cell, the rail shared by the tagged cell and restricted cell, and a given offset requirement to ensure the appropriate degree of overlap or to ensure a minimum distance between cells. For instance, the offset may indicate a certain number of pitches of common run that the new/restricted cell must have with the tagged cell. "Common run" can refer to the length (e.g., number of pitches) of the overlap between boundaries of the two adjacent cells. The techniques disclosed herein provide greater flexibility in cell placement while still preventing cells from being placed in combinations/configurations that cause DRC failures or failures in other constraints. Once the functional cells are placed, a separate fill algorithm can be run to fill any gaps between cells.

Figure 2A:
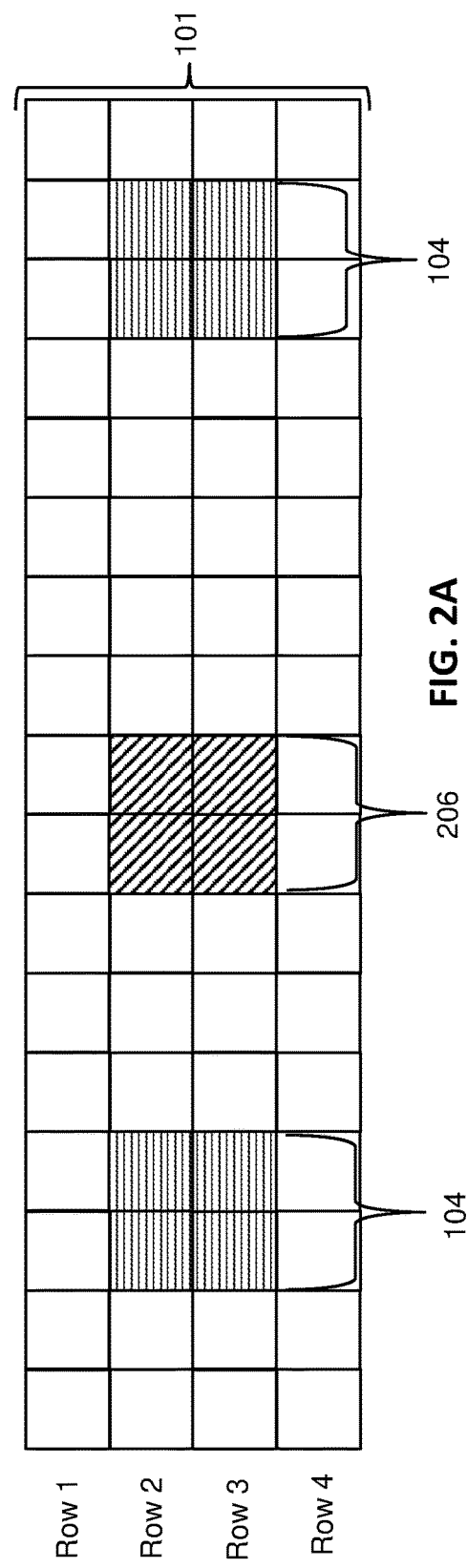
FIG. 2A illustrates an example semiconductor layout with customized initial placement of logic cells device according to embodiments of the invention.

Turning now to a more detailed description of aspects of the present invention, FIG. 1 depicts an example semiconductor layout 100 with regular placement of logic cells. The semiconductor layout 100 shown in FIG. 1 may represent one macro block 101 of many (e.g., hundreds, thousands, etc.) in a larger semiconductor layout, although for ease of understanding only one macro block 101 is illustrated. As shown in FIG. 1, a macro block 101 can be divided by various rows and columns into a grid-like pattern, wherein cells such as functional cells and fill cells can be placed or positioned at one or more squares of the grid. According to some embodiments, the macro block 101 shown in FIG. 1 may only be portion of a standardized macro block that has a larger size (i.e., a macro block can have more rows and/or columns then are shown in FIG. 1). Although FIG. 1 shows the macro block 101 as having 4 rows and 17 columns, it should be understood that in various embodiments a macro block may have more or less numbers of rows and/or columns. A macro block is a collection of cells (with each cell containing any number of transistors or other device types) that provides a useful layer of hierarchical abstraction for designing an integrated circuit that may contain billions of transistors. Although only one macro block 101 is shown in FIG. 2A and discussed herein, it should be understood that discussions about macro block 101 apply by analogy to other macros blocks in the semiconductor layout 100. For example, the macro block 101 shown in FIG. 1 can be surrounded by other macro blocks and can be hierarchically within an even larger macro block. The preceding description also applies to the macro block 101 in semiconductor layout 200 shown in FIGS. 2A-2C described in more detail below.

FIG. 1 shows an example of a semiconductor layout 100 in which multiple logic cells have been placed according to a regular placement pattern. For example, a first type of logic cell 102 has a width of three pitches (i.e., three standardized distance units or "squares" of the macro block 101 grid) and it placed every 8 pitches such that there is a 5-pitch gap between instances of each first type of logic cell 102. A second type of logic cell 104 has dimensions of 2×2 pitches and is similarly placed every 8 pitches, such that there is a 6-pitch gap between each instance of the second type of logic cell 104. The blocks (i.e., squares of the grid) that have not been placed with any logic cell remain as empty cells 106. According to some embodiments, the empty cells 106 may be filled in with other logic cells or with fill cells at a subsequent time during the place and fill routines responsible for filling the semiconductor layout 100 to create the "brick wall" previously described above. In the example shown in FIG. 1, there is no common run between the first type of logic cell 102 and the second type of logic cell 104. In other words, there is no overlap between the edges of any instance of the first type of logic cell 102 and the second type of logic cell 104. Although the example in FIG. 1 only depicts a few instances of logic cells 102, 104, it will be understood that this type of regular placement scheme would be expanded beyond what is shown in FIG. 1 and could include for example, hundreds or thousands of regularly spaced logic cells having the same relative placement to one another. This type of regular logic cell placement scheme can ensure DRC compliance with respect to the interactions between logic cells because it may be known that the relative placement of these types of cells in this configuration does not give rise to DRC failures. However, as shown in FIG. 1, such a regular placement scheme can be inflexible and inefficient because there are many empty cells 106 that might otherwise contain logic cells if the space were more efficiently utilized and the regular placement scheme cannot generally accommodate randomly placed logic cells because there is no guarantee that such random placement will not give rise to problematic cell configurations that generate DRC failures.

FIGS. 2A, 2B and 2C depict an example tagging and placement of logic cells in accordance with embodiments of the present invention. Embodiments of the present invention include a logic cell tagging and placement routine that can be executed by a computing device to tag logic cells with one or more cell placement restrictions rules, place logic cells in a semiconductor layout 200, and if necessary, to adjust the position of placed logic cells based on the cell placement restriction rules tagged to other placed logic cells. The logic cell tagging and placement routine can allow for the flexible (i.e., non-regular) placement of logic cells in a manner that nonetheless ensures DRC compliance. As shown in FIG. 2A, instances of the second type of logic cell 104 and a third type of logic cell 206 can be placed in the semiconductor layout 200. According to some embodiments, as each cell is placed, the cell can be tagged with one or more cell placement restriction rules that can specify relative placement rules for one or more other types of cells placed within a predetermined proximity of the placed cell. According to some embodiments the predetermined proximity may be uniform for all tagged cells, such that when a new cell is placed it is only necessary to verify that the placement satisfies cell placement restriction rules associated with other cells within the predetermined proximity. In some embodiments, different cell placement restriction rules may specify different predetermined proximities such that it can be necessary to verify that the placement of a new cell satisfies the cell placement restrictions rules associated with all other tagged cells or all other tagged cells within a predetermined maximum distance (e.g., within a predetermined maximum number of a pitches).

In some embodiments, a cell placement restriction rule can specify an offset requirement associated with a type of restricted logic cell (i.e., a cell of the specified type that is placed within the predetermined proximity of the tagged cell). The offset requirement can specify one or more acceptable amounts of common run between the tagged logic cell and the restricted logic cell. According to some embodiments, the cell placement restriction rule may only apply to restricted cells (i.e., newly placed cells of the specified type) that are placed within a predetermined proximity of the tagged cell. According to some embodiments, a predetermined proximity may be a number of pitches, such as within 1 pitch, within 2 pitches, within 3 pitches or any other specified number of pitches of the tagged cell. According to some embodiments, in determining whether a placed cell is within the predetermined number of pitches from the tagged cell, the routine may consider an area around the cell that is extended both horizontally and vertically by the specified number of pitches in each direction. For example, if the specified number of pitches is 2 and the tagged cell is a 2×2 cell, the examined area may cover the area of the tagged cell as extended by 2 pitches north, 2 pitches south, 2 pitches east and 2 pitches west. In other words, the examined area may result in a 6×6 pitch area with the tagged cell at the center. If any of the examined area includes a portion of the restricted cell, then the restricted cell may be considered to be within the predetermined proximity of the tagged cell and the cell placement restriction rule will be applied to the restricted cell. When a restricted cell is placed within the predetermined proximity of a tagged cell such that the cell placement restriction rule is determined to apply to the restricted cell, the computing system can apply the offset specified by the cell restriction rule to the restricted cell to adjust the position of the restricted cell to satisfy the rule.

In some embodiments, the cell placement restriction rule can also specify a rail associated with the offset rule. In other words, the cell placement restriction rule may identify the type of rail that the restricted type of cell must be placed on in order for the offset to apply to the restricted cell. According to some embodiments, the cell placement restriction rule may identify the same rail (e.g., such as a positive voltage supply rail, a negative voltage supply rail, etc.) that the cell that has been tagged with the cell placement restriction rule is on as the rail upon which placement of the restricted cell may trigger the use of the offset requirement. In other words, in some embodiments, if the restricted cell is connected to a different rail than the tagged cell, then the offset requirement may not be invoked. More generally, one of a north/south/east/west edge restriction may be specified rather than a particular rail name or type.

In the example shown in FIG. 2A, the second type of logic cell 104 can be tagged with one or more cell placement restrictions rules, that can be applied if a restricted cell is positioned within a predetermined proximity of, for example, 1-pitch of the tagged cell. For example, the second type of logic cell 104 may have a first cell placement restriction rule that specifies that the third type of logic cell 206 is restricted and specifies an offset requirement that applies to instances of the third type of logic cell 206 placed within the predetermined proximity. The second type of logic cell 104 may also be tagged with a second cell placement restriction rule that specifies that the first type of logic cell 102 is restricted and specifies an offset requirement that applies to instances of the first type of logic cell 102 placed within the predetermined proximity. Thus, as shown in FIG. 2A, an instance of the third type of logic cell 206 can be placed in the semiconductor layout 200 without activating the cell restriction rules of the two instances of the second type of logic cell 104, as the instance of the third type of logic cell 206 is positioned outside of the predetermined proximity of 1-pitch from the tagged cells. However, FIG. 2B illustrates the initial placement of multiple instances of the first type of logic cell 102 that do fall within a predetermined proximity of 1-pitch from the two instances of the second type of logic cell 104, and thus, if the cell placement restriction rule associated with the second type of logic cell 104 lists the first type of logic cell 102 as a restricted cell, the system will apply the cell placement restriction rule of the tagged instances of the second type of logic cell 104 to apply the offset requirement to the corresponding instances of the first type of logic cell 102. According to some embodiments, the offset requirement can specify a minimum common run, a maximum common run, one or more specified ranges of acceptable common run (e.g., an odd or even number of overlapping pitches).

As shown in FIG. 2C, if the initial placement of a restricted cell does not satisfy the offset requirement, the system may adjust the position of the restricted cell to satisfy the offset requirement. For example, the second type of logic cell 104 may have a cell placement restriction rule that specifies that, if there is non-zero common run in the initial placement of instances of the first type of logic cell, then instances of the first type of logic cell 102 must have a minimum common run of at least 2 pitches, or alternatively that the common run must be an even number of pitches. In either case, as shown in FIG. 2C, the system may adjust the position of the left-most instance of the first type of logic cell 102 by shifting it to the right one pitch so that the common run (i.e., the shared north-south boundary of the logic cells) changes from being 1-pitch long to being 2-pitches long (i.e., satisfying a requirement of a minimum common run of 2 pitches and also an even number of pitches). In contrast, although the right-most instance of the first type of logic cell 102 is within the predetermined proximity of a tagged instance of the second type of logic cell 104, the initial placement of the restricted cell (i.e., the first type of logic cell 102) as shown in FIG. 2B may already satisfy the offset requirement (e.g., because there was no initial overlap between boundaries), and therefore as shown in FIG. 2C the system may simply verify that the position is DRC-compliant and leave the cell in place. It should be understood that offset requirements may vary and the examples provided herein are merely illustrative. For example, in some cases it may be desirable to enforce a grouping of certain cells and a restriction rule may require some overlap between the specified cell types (e.g., to ensure that cells are locked into a common pitch if there are partial overlaps but it is desirable to have the cells be fully aligned). In some cases, a designer may want to require some cells to have a similar level of local variability by being placed on a given PC pitch or power rail. Those of skill in the art will appreciate that the restriction rules and offsets can specify a variety of different desired special relationships or commons runs between cell types.

As shown in FIGS. 2B and 2C, the third type of logic cell 206 may also have a cell placement restriction rule with respect to the first type of logic cell 102, however its cell placement restriction rule may be different than that of the second type of logic cell 104. For example, the third type of logic cell 206 may have a cell placement restriction rule that specifies that the two types of logic cells must have no common run. As shown in FIG. 2B, the initial common run between the instance of the third type of logic cell 206 and the first type of logic cell 102 is 1 pitch, and therefore as shown in FIG. 2C, the system may adjust the position of the nearby instance of the first type of logic cell 102 to move to the right 1 pitch so that there are no overlapping edges between the two cells. According to some embodiments, an offset rule may require pushing a restricted cell further than one pitch away from the tagged cell, such as for example, pushing the restricted cell outside of the predetermined proximity. In accordance with the techniques described herein, embodiments of the disclosure allow for highly customized or even random placement of logic cells and the tagging and placement routines described herein will adjust any problematic configurations to ensure DRC compliance.

According to some embodiments, one or more cell placement restriction rules can be developed prior to tagging and placement of logic cells as described herein based on known or previously discovered combinations of problematic cell configurations. Although FIGS. 2A, 2B and 2C are generally described with respect to a common run between the north-south edges of logic cells, it should be appreciated that it is contemplated that cell placement restriction rules may apply to either or both or north-south and east-west boundaries of cells. Further, although FIGS. 2A, 2B and 2C generally depict logic cells as being rectangular in shape, as will be appreciated by those of skill in the art logic cells can be many different shapes (e.g., L-shaped).

Figure 3:
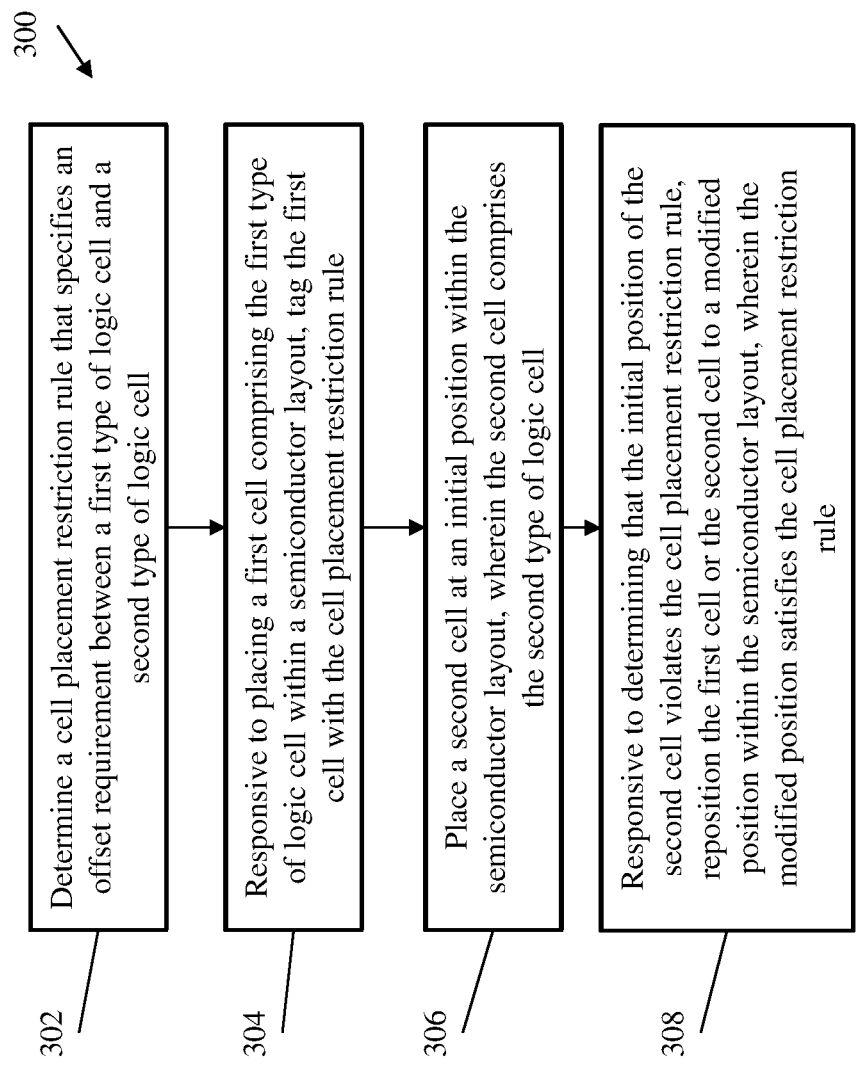
FIG. 3 illustrates a flow diagram of a process for providing flexible constraint-based logic cell placement in accordance with one or more embodiments of the present invention.

Turning now to FIG. 3, a flow diagram of a method 300 for providing flexible constraint-based logic cell placement in accordance with an embodiment is shown. In one or more embodiments of the present invention, the method 300 may be embodied in software that is executed by computer elements of computer 500 described above and illustrated in FIG. 5, computer elements located within a network that may reside in the cloud, such as the cloud computing environment 50 described herein above and illustrated in FIGS. 6 and 7. In other embodiments, the computer elements may reside on a computer system or processing system, such as the processing system 800 described herein above and illustrated in FIG. 8, or in some other type of computing or processing environment.

The method 300 begins at block 302 and includes determining (e.g., via computer 500) a cell placement restriction rule that specifies an offset requirement between a first type of logic cell and a second type of logic cell. Different "types" of logic cells can refer to an arbitrary collections of shapes in which it is desirable to specify a common run or spatial relationship relative to other arbitrary collections of shapes, and can include for example, logic cells having different threshold voltages or logic cells that are made up of different types of logic elements and/or gates. According to some embodiments, the cell placement restriction rule is determined based on a list of relative logic cell placement combinations that lead to design rule check (DRC) violations or other known issues relating to cell combinations that cause for example, local heating issues, introduction of large local current draw that could cause local voltage drops/spikes/noise, and/or patterning problems that are generally detected using lithography checking tools. This list may be constructed or accumulated based on previously known configurations/combinations of logic cells that generate DRC failures or other such known issues. In some embodiments, the offset requirement can specify one or more acceptable amounts of common run between the first type of logic cell and the second type of logic cell when the first type of logic cell and the second type of logic cell are positioned within a predetermined proximity of one another within the semiconductor layout. For example, in some embodiments, the offset requirement can define a minimum amount of overlap between boundaries of instances of two different types of logic cells that are proximate one another. In some embodiments, the offset requirement can define a maximum amount of overlap between boundaries of the first type of logic cell and the second type of logic cell. As will be understood by those of skill in the art, minimum and/or maximum amounts of overlap between cell boundaries can be measured or denoted by a specified number of pitches (i.e., standardized units of distance based on an aspect of the circuit design). According to some embodiments, the offset requirement can define an acceptable overlap between boundaries of the first type of logic cell and the second type of logic cell as being either an even number of pitches or an odd number of pitches. For example, for some combinations of different cell types, DRC failures may be avoided if the overlap between two different types of logic cells spans an even number of pitches, whereas DRC failures may be avoided for a different pair of cell types when the overlap between the edges of the cells spans an odd number of pitches.

In some embodiments, the cell placement restriction rule can further specify one or more of a rail, edge or coordinate associated with the offset requirement. For example, the cell placement restriction rule may specify that the restricted (i.e., newly placed) cell must be on the same type of rail as the tagged cell in order to call for application of the offset requirement. According to some embodiments, specifying the VDD rail can cause the system to ensure that for two adjacent cell placements the PFETs of the cells are properly aligned. Specifying the VSS rail can cause the system to ensure that for two adjacent cell placements the n-type field effect transistors (NFETs) of the cells are properly aligned. In some embodiments, a cell placement rule may specify the relative vertical placement of cells (as opposed to the relative horizontal placement) by restricting or controlling the placement of neighboring cells on the east and/or west edges of a cell associated with the restriction rule. In these cases, instead of specifying a rail name (as in the context of library cells, rails may always be N/S, referring to circuit row boundaries), the restriction rule may instead specify "EW". According to some embodiments, a restriction rule may specify that there is a shape in the middle of the logic cell associated with the restriction rule that is not allowed to have any other shape in the library cell within 200 nm, in which case the restriction rule may specify that no other cell with this property is allowed to be placed within 200 nm of a coordinate that is positioned at the center of the logic cell associated with the restriction rule.

As shown at block 304, the method includes tagging (e.g., via computer 500) a first cell of the first type of logic cell with the cell placement restriction rule in response to placing the first cell within a semiconductor layout. In some embodiments, as will be appreciated by those of skill in the art, one or more logic cells can be initially placed in accordance with a placement routine that can, for example, randomly place cells within the semiconductor layout, place cells in the semiconductor layout in accordance with a predetermined algorithm or place cells based on other considerations or aspects as is known in the art. In some embodiments, one or more logic cells can be initially placed manually based on a user input. According to some embodiments, "tagging" can mean associating a cell placement restriction rule with a cell, such that when a new cell is being considered to be placed within a predetermined proximity of the tagged cell, the system will check the cell placement restriction rule of the tagged cell to ensure that placement of the new cell complies with the rule.

As shown at block 306, the method includes placing (e.g., via computer 500) a second cell at an initial position within the semiconductor layout. According to some embodiments, the second cell may be the second type of logic cell. Although embodiments of the invention describe placement of various cells in sequential fashion, it should be understood that in various embodiments the placement of multiple cells may occur simultaneously and/or iteratively in groups, or in any order.

As shown at block 308, the method includes repositioning (e.g., via computer 500) the first cell or the second cell to a modified position within the semiconductor layout, wherein the modified position satisfies the cell placement restriction rule in response to determining that the initial position of the second cell violates the cell placement restriction rule. According to some embodiments, determining that the initial position of the second cell violates the cell placement restriction rule includes determining that the second cell has been placed on the rail specified by the cell placement restriction rule. In some embodiments, repositioning the first cell or the second cell to a modified position can include repositioning the first cell or the second cell to increase an amount of overlap between the boundaries of the first and second cell (e.g., based on a minimum amount of overlap between boundaries of the first cell and the second cell). According to some embodiments, the method may default to repositioning the second cell, however in some cases the second cell may be placed at the initial position for a particular reason and in such cases it may instead be desirable to leave the second cell at the initial position and instead move the position of the first cell to a new location that satisfies the cell placement restriction rule. For example, in some cases cells (such as the second cell) may be given preferential treatment despite being added into the semiconductor layout "late" (i.e., after the general placement of other cells) as a post-fill requirement. For example, if a substrate contact has a requirement that it must be placed with a periodicity of less than 25 um and such a substrate contact is placed "late", but its initial placement position is the only spot it can fit in because it is a large cell and the rest of the region does not have enough room for it to be plugged in, then the system may instead preferentially move the prior placed first cell (which may be much smaller) to a different location that the first cell would be able to fit into. In some embodiments, repositioning the first cell or the second cell to a modified position can include repositioning the first cell or the second cell to decrease an amount of overlap between the boundaries of the first cell and the second cell (e.g., based on a maximum amount of overlap between boundaries of the first cell and the second cell). According to some embodiments, repositioning the second cell to a modified position can include repositioning the second cell to have an overlapping boundary with the first cell that has a length that is an even or odd number of pitches (e.g., based on offset requirement specifying an overlapping boundary having either an even or odd number of pitches).

Figure 4:
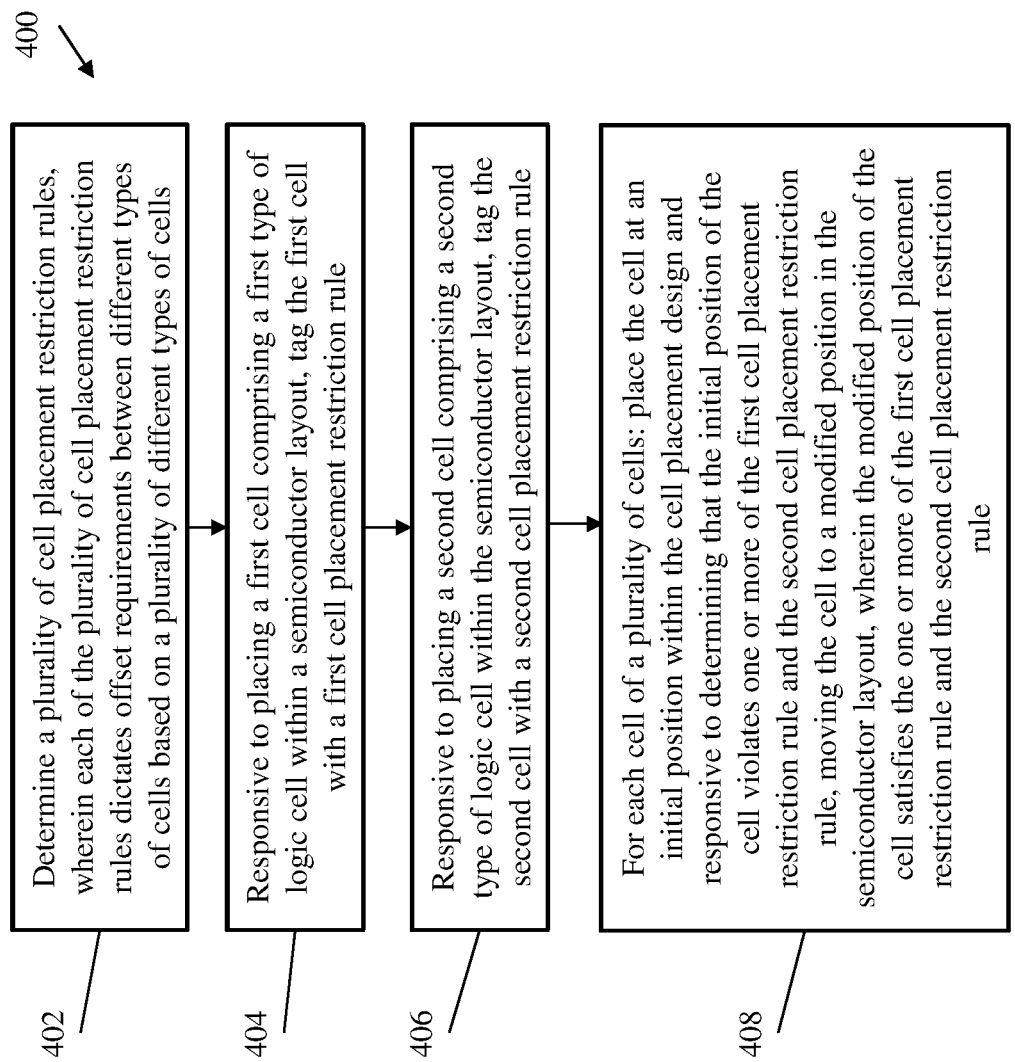
FIG. 4 illustrates a flow diagram of another process for providing flexible constraint-based logic cell placement in accordance with one or more embodiments of the present invention.

Turning now to FIG. 4, a flow diagram of another method 400 for providing flexible constraint-based logic cell placement in accordance with an embodiment is shown. In one or more embodiments of the present invention, the method 400 may be embodied in software that is executed by computer elements of computer 500 described above and illustrated in FIG. 5, located within a network that may reside in the cloud, such as the cloud computing environment 50 described herein above and illustrated in FIGS. 6 and 7. In other embodiments, the computer elements may reside on a computer system or processing system, such as the processing system 800 described herein above and illustrated in FIG. 8, or in some other type of computing or processing environment.

The method 400 begins at block 402 and includes determining (e.g., via computer 500) a plurality of cell placement restriction rules. Each of the plurality of cell placement restriction rules can dictate offset requirements between different types of cells based on a plurality of different types of cells. For example, as explained above, different combinations of different logic cell types may cause DRC failures or other problems when configured in various arrangements proximate one another and offset requirements can specify acceptable amounts of common run between two different types of logic cell, such that when the offset requirement is met a potential DRC failure or other known problem based on the proximate combination of cell types will be avoided.

As shown at block 404, the method includes tagging (e.g., via computer 500) a first cell with a first cell placement restriction rule in response to placing the first cell within a semiconductor layout. As shown at block 406, the method includes tagging (e.g., via computer 500) a second cell with a second cell placement restriction rule in response to placing the second cell within the semiconductor layout. The first cell can be the first type of logic cell and the second cell can be the second type of logic cell. It should be understood that each of the first cell and the second cell may have a plurality of cell placement restriction rules, each specifying an offset requirement relative to a different other type of logic cell.

As shown at block 408, the method includes, for each cell of a plurality of cells: placing (e.g., via computer 500) the cell at an initial position within the semiconductor layout and moving the cell to a modified position in response to determining that the initial position of the cell violates one or more of the first cell placement restriction rule and the second cell placement restriction rule. The modified position of the cell is a position that satisfies the one or more of the first cell placement restriction rule and the second cell placement restriction rule. In other words, as each new logic cell is placed in the semiconductor layout, the system will check the cell placement restriction rules of nearby (e.g., within a predetermined proximity) tagged cells to ensure compliance with the rules by adjusting the position of the new logic cells if necessary.

Additional processes may also be included. It should be understood that the processes depicted in FIGS. 3 and 4 represent illustrations, and that other processes may be added or existing processes may be removed, modified, or rearranged without departing from the scope and spirit of the present disclosure.

As described above, FIGS. 2A, 2B, 2C, FIG. 3 and FIG. 4 provide techniques for flexible constraint-based logic cell placement within a semiconductor layout for building a semiconductor device using the computer system 500. The computer system 500 has one or more software applications 502 configured to function and implement operations as discussed herein. The software applications 502 provide a mechanism for enabling the customized placement of different types of functional cells within a semiconductor layout in a manner that avoids DRC failures based on problematic configurations of cells without the need for using a regular placement scheme. These techniques allow for greater flexibility in the placement of functional cells and more efficient use of space in the semiconductor layout. According to embodiments of the invention, software applications 502 can function as an automated tooling to allow DRC compliant relative placement of functional cells. As will be understood by those of skill in the art, software applications 502 can also include one or more routines or algorithms to fill in the semiconductor layout with fill cells to occupy all remaining spaces of the semiconductor layout that are not occupied by functional cells to create a DRC complaint "brick wall" (i.e., a semiconductor layout that is completely filled with functional cells and fill cells).

Figure 5:
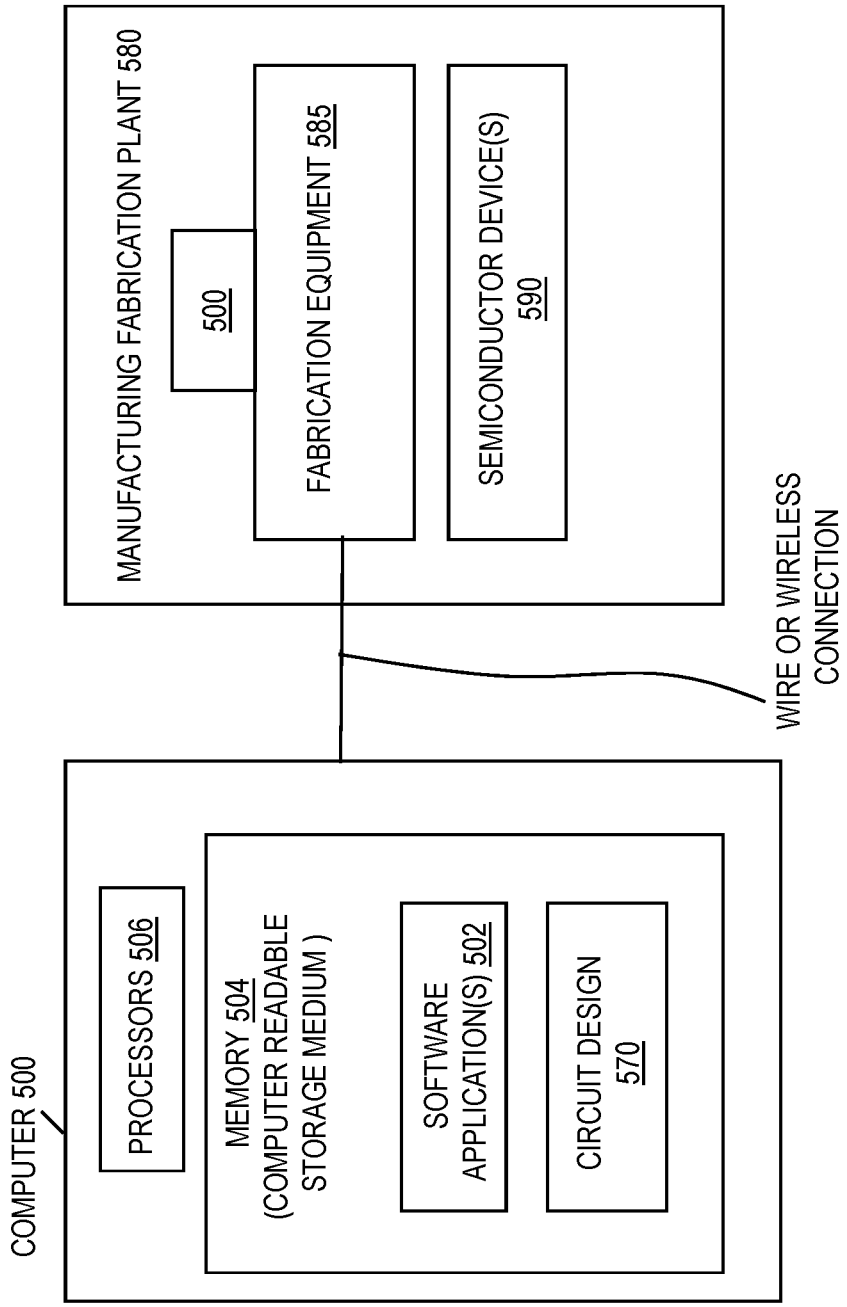
FIG. 5 depicts a system of a computer system integrated with a manufacturing fabrication plant according to embodiments of the invention.

According to some embodiments, a semiconductor layout (such as the example semiconductor layout 200 shown in FIG. 2C) can be constructed by the software application 502 of the computer 500 to build the semiconductor device (e.g., an integrated circuit). The computer 500 is configured to guarantee design rule cleanliness (i.e., pass) for the semiconductor device before and/or without requiring a design rule check. The software applications 502 include, integrate, are coupled to, and/or function as electronic design automation (EDA), also referred to as electronic computer-aided design (ECAD). Electronic design automation is a category of software tools for designing electronic systems such as integrated circuits and printed circuit boards. The tools work together in a design flow that chip designers use to design and analyze entire semiconductor chips. In some implementations, the computer 500 is coupled to, integrated with, and/or part of the fabrication equipment 585 at the manufacturing fabrication plant 580 (so as to communicate with and/or control operations of the fabrication equipment 585) to thereby fabricate semiconductor device(s) 590 as depicted in FIG. 5, as understood by one skilled in the art. The computer 500 includes one or processors 506 configured to execute one or more software applications 502 in memory 504. The computer 500 receives input of a design 570 for the semiconductor device 590, and the computer 500 is configured to develop/form the semiconductor layout 200 for the semiconductor device in order to build the semiconductor device. The semiconductor layout 200 is a physical design released to the manufacturing fabrication (Fab) plant 580 and physically fabricated by the fabrication equipment 585 to produce the semiconductor device 590. The manufacturing fabrication plant 580 builds the photo mask from the semiconductor layout 200 as a physical design, and then builds the actual product using the photo mask. The product is an integrated circuit (i.e., semiconductor device 590) on a wafer according to the semiconductor layout 200 (physical design). There may be numerous integrated circuits on a wafer, and each integrated circuit may be diced into an individual chip.

A logic cell placement routine such as that described above with respect to FIGS. 2A-2C can be implemented in the software application 502 and/or coupled to the software application 502. Each semiconductor layout 200 is a grid on a wafer/substrate, and the grid has rows (for example rows 1, 2, 3 and 4 identified in FIG. 2A). As one example of the logic cell placement routine of the software application 502, the logic cell placement routine (i.e., software application 502) scans from left-to-right in each row in the semiconductor layout 200, progressively tagging and placing functional cells in accordance with a plan that specifies the overall functionality of the IC according to a logical description of the intended IC and corresponding placement and routing tooling (whether manual or automated). As each new functional cell is placed within a predetermined proximity of a tagged functional cell that has already been placed, computer 500 can reference the cell placement restriction rule(s) of all previously placed functional cells within the predetermined proximity of the newly cell and if necessary, adjust the position of the newly placed cell to comport with the cell placement restriction rule(s). In this manner, the logic cell placement routine can ensure that each placed functional cell is DRC compliant with respect to its interactions with other nearby functional cells. According to some embodiments of the invention, a logic cell routine can randomly place functional cells within a semiconductor layout and upon placing each new cell, verify or adjust the position of the new cell based on the cell placement restriction rules of previously placed cells within a predetermined proximity of the initial placement of the new cell. Further, in some embodiments of the invention, one or more functional cells can be placed manually by a designer and the computer 500 may automatically verify or adjust the position of the manually placed functional cell based on the cell placement restriction rules of previously placed nearby functional cells in the manner described above. As will be appreciated by those of skill in the art, many different routines or algorithms could be used to initially place functional cells, an in each such embodiment, it is contemplated that the placement of new functional cells will be verified or adjusted based on the computer 500 performing a check against the cell placement restriction rules of nearby (i.e., within a predetermined proximity) functional cells.

According to some embodiments of the invention, after a logic cell placement routine completes placement and repositioning (if necessary) of the functional cells, a fill routine may fill in the remaining empty spaces of the semiconductor layout with fill cells in order to build the semiconductor device 590, and the semiconductor layout 200 does not require a design rule check to be performed because the semiconductor layout 200 was constructed as a guaranteed clean fill strategy. Each cell can be considered a collection of design shapes as understood by one skilled in the art.

Technical benefits and advantages provide a cell-based correct-by-construction technique which does not simply merge shapes in a semiconductor device but guarantees meeting design rule check without or prior to any design rule check. Thereby, the correct-by-construction technique improves the integrated circuit (i.e., semiconductor device 590), and improves the operation of the integrated circuit (e.g., used in a computer system) by preventing potential errors discussed herein.

Figure 6:
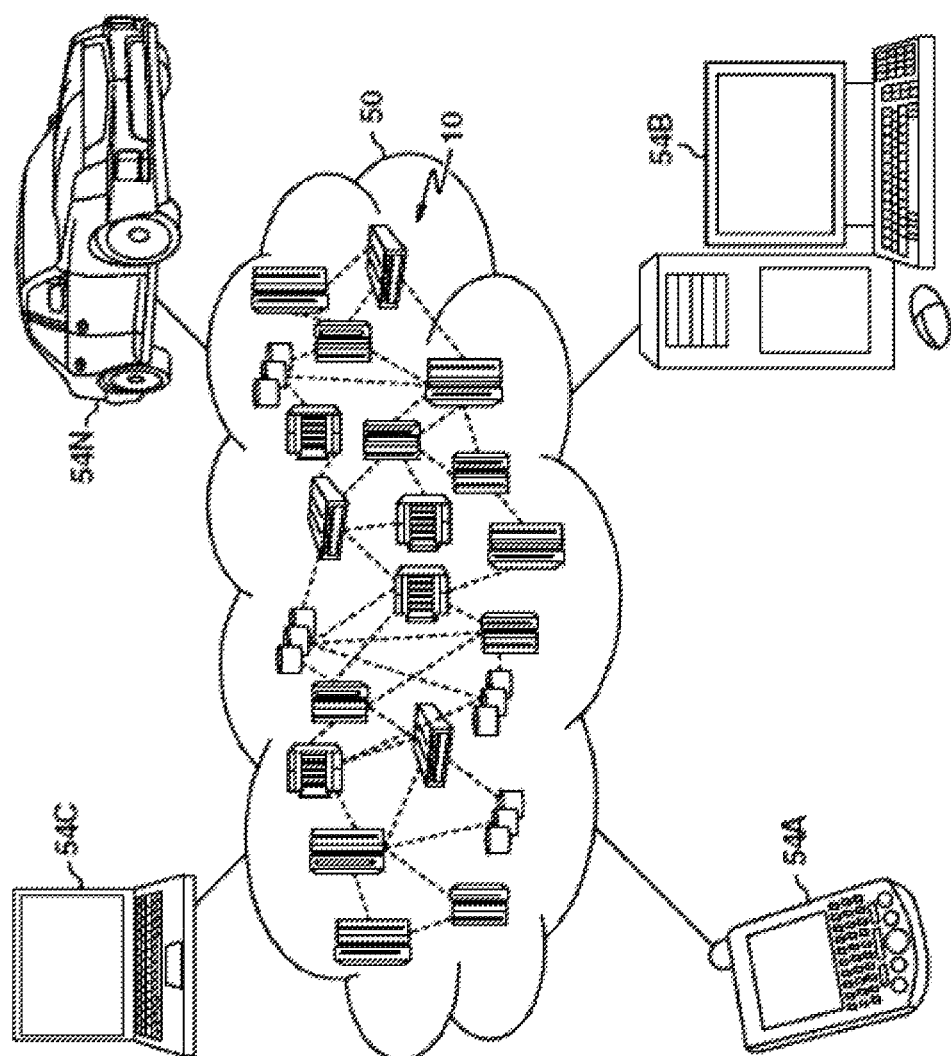
FIG. 6 illustrates a cloud computing environment according to one or more embodiments of the present invention.
Figure 7:
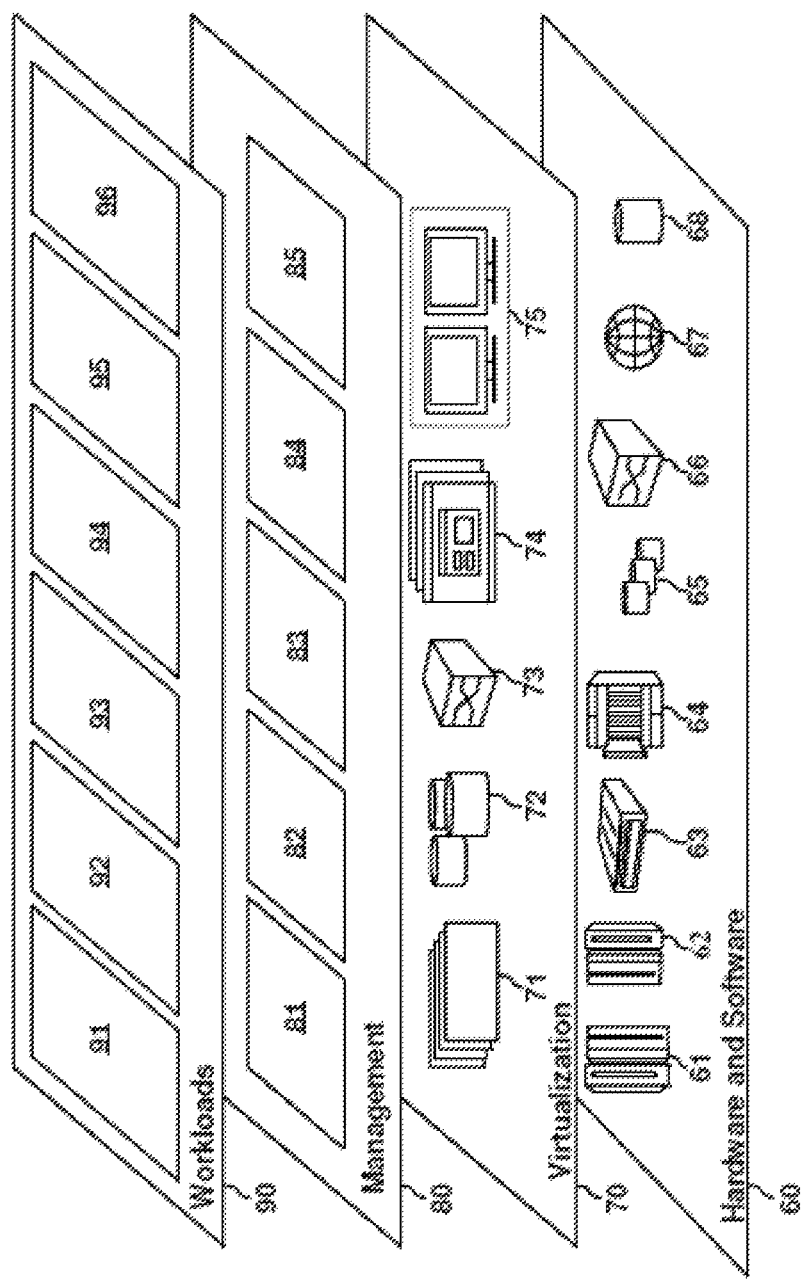
FIG. 7 illustrates abstraction model layers according to one or more embodiments of the present invention.

FIG. 6 depicts a cloud computing environment according to one or more embodiments of the present invention. FIG. 7 depicts abstraction model layers according to one or more embodiments of the present invention.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 6, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 6 are intended to be illustrative only and that computing nodes 10 and cloud computing environment 50 can communicate with any type of computerized device over any type of network and/or network addressable connection (e.g., using a web browser).

Referring now to FIG. 7, a set of functional abstraction layers provided by cloud computing environment 50 (FIG. 6) is shown. It should be understood in advance that the components, layers, and functions shown in FIG. 7 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and providing flexible constraint-based logic cell placement 96.

Figure 8:
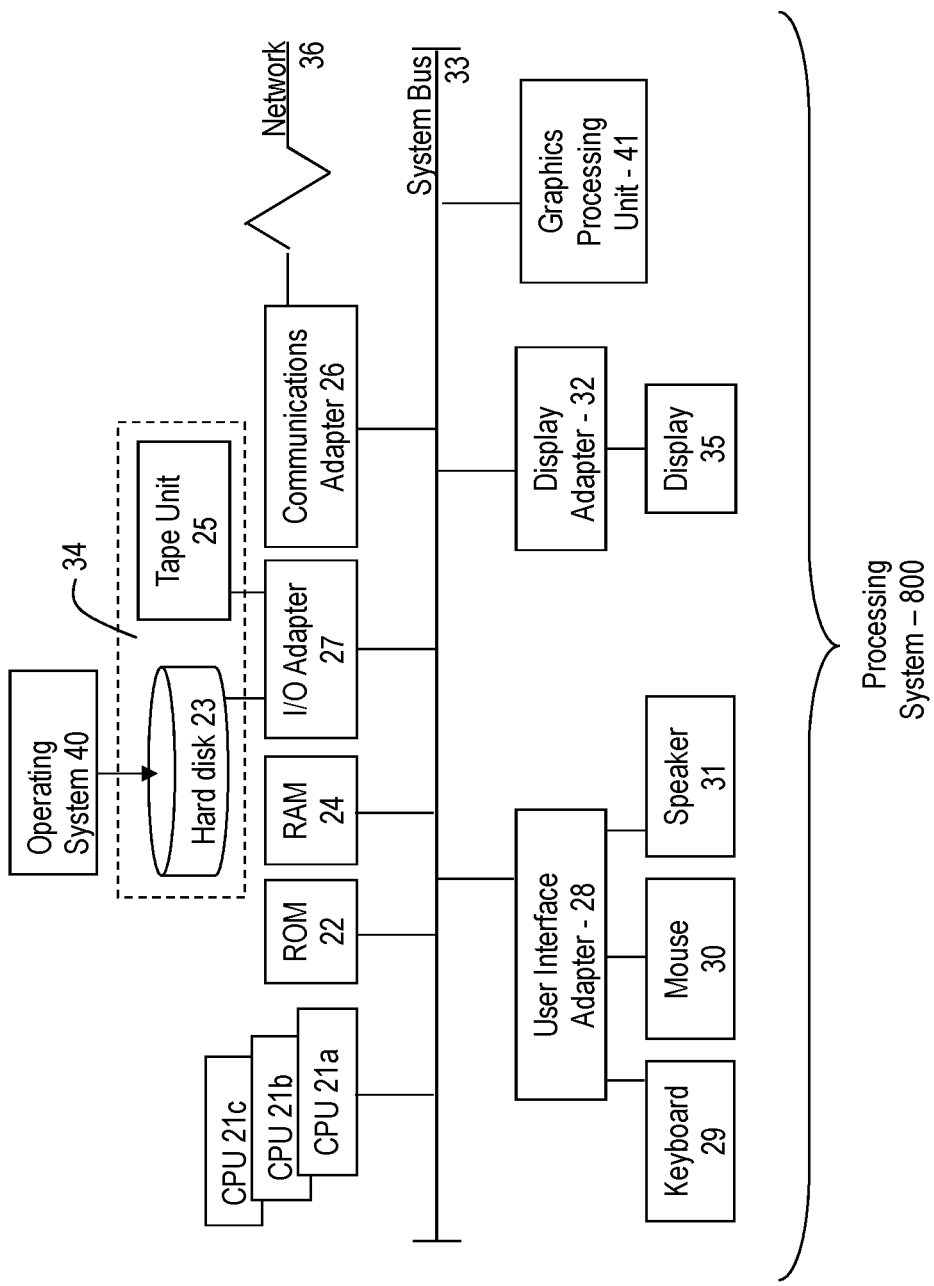
FIG. 8 illustrates a block diagram of a computer system for use in implementing one or more embodiments of the present invention.

FIG. 8 depicts a processing system for implementing one or more embodiments of the present invention;

It is understood that one or more embodiments of the present invention are capable of being implemented in conjunction with any other type of computing environment now known or later developed. For example, FIG. 8 depicts a block diagram of a processing system 800 for implementing the techniques described herein. In accordance with one or more embodiments of the present invention, computer 500 and/or system 800 can be an example of a cloud computing node 10 in FIG. 6. In the embodiment shown in FIG. 8, processing system 800 has one or more central processing units (processors) 21a, 21b, 21c, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of processing system 800.

Further illustrated are an input/output (I/O) adapter 27 and a communications adapter 26 coupled to system bus 33. I/O adapter 27 can be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 800 can be stored in mass storage 34. The RAM 24, ROM 22, and mass storage 34 are examples of memory 19 of the processing system 800. A network adapter 26 interconnects system bus 33 with an outside network 36 enabling the processing system 800 to communicate with other such systems.

A display (e.g., a display monitor) 35 is connected to system bus 33 by display adaptor 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, processing system 800 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, processing system 800 includes processing capability in the form of processors 21, storage capability including system memory (e.g., RAM 24), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in processing system 800.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   determining a cell placement restriction rule for a first type of logic cell that specifies relative placement rules for one or more other cell types placed within a predetermined proximity to the first type of logic cell, the predetermined proximity comprising a number of pitches, the cell placement restriction rule comprising an offset requirement between the first type of logic cell and a second type of logic cell;
   responsive to placing a first cell comprising the first type of logic cell within a semiconductor layout, tagging the first cell with the cell placement restriction rule for the first type of logic cell;
   placing a second cell at an initial position within the semiconductor layout, wherein the second cell comprises the second type of logic cell;
   determining whether any portion of the second cell is within the predetermined proximity of the first cell by considering an area around the first cell that is extended both horizontally and vertically by the predetermined number of pitches;
   responsive to determining that a portion of the second cell is within the predetermined proximity, applying the cell placement restriction rule to the second cell; and
   responsive to determining that the initial position of the second cell violates the cell placement restriction rule, repositioning the first cell or the second cell to a modified position within the semiconductor layout, wherein the modified position satisfies the cell placement restriction rule by positioning the first cell and the second cell in a relative manner that satisfies the offset requirement.

2. The computer-implemented method of claim 1, wherein the cell placement restriction rule is determined based on a list of relative logic cell placement combinations that lead to design rule check (DRC) violations, and the second cell is tagged with a second cell placement restriction rule against cell placement that would result in DRC violations specific to the second cell.

3. The computer-implemented method of claim 1, wherein the offset requirement specifies one or more acceptable amounts of common run between the first type of logic cell and the second type of logic cell when the first type of logic cell and the second type of logic cell are positioned within a predetermined proximity of one another within the semiconductor layout.

4. The computer-implemented method of claim 3, wherein the cell placement restriction rule further specifies one or more of a voltage supply rail, cell edge or position associated with the offset requirement.

5. The computer-implemented method of claim 4, wherein determining that the initial position of the second cell violates the cell placement restriction rule comprises determining that the second cell has been placed on the voltage supply rail specified by the cell placement restriction rule.

6. The computer-implemented method of claim 1, wherein the offset requirement defines a minimum amount of overlap between boundaries of the first cell and the second cell and repositioning the first cell or the second cell to a modified position comprises repositioning the first cell or the second cell to increase an amount of overlap between the boundaries of the first cell and the second cell.

7. The computer-implemented method of claim 6, wherein the minimum amount of overlap comprises a specified number of pitches.

8. The computer-implemented method of claim 1, wherein the offset requirement defines a maximum amount of overlap between boundaries of the first cell and the second cell and repositioning the first cell or the second cell to a modified position comprises repositioning the second cell to decrease an amount of overlap between the boundaries of the first cell and the second cell.

9. The computer-implemented method of claim 1, wherein the maximum amount of overlap comprises a specified number of pitches.

10. The computer-implemented method of claim 1, wherein the offset requirement defines an acceptable overlap between boundaries of the first cell and the second cell as comprising either an even number of pitches or an odd number of pitches.

11. A system comprising:
a memory having computer readable instructions; and
one or more processors for executing the computer readable instructions, the computer readable instructions controlling the one or more processors to perform operations comprising:
determining a cell placement restriction rule for a first type of logic cell that specifies relative placement rules for one or more other cell types placed within a predetermined proximity to the first type of logic cell, the predetermined proximity comprising a number of pitches, the cell placement restriction rule comprising an offset requirement between the first type of logic cell and a second type of logic cell;
responsive to placing a first cell comprising the first type of logic cell within a semiconductor layout, tagging the first cell with the cell placement restriction rule for the first type of logic cell;
placing a second cell at an initial position within the semiconductor layout, wherein the second cell comprises the second type of logic cell; and
determining whether any portion of the second cell is within the predetermined proximity of the first cell by considering an area around the first cell that is extended both horizontally and vertically by the predetermined number of pitches;
responsive to determining that a portion of the second cell is within the predetermined proximity, applying the cell placement restriction rule to the second cell; and
responsive to determining that the initial position of the second cell violates the cell placement restriction rule, repositioning the first cell or the second cell to a modified position within the semiconductor layout, wherein the modified position satisfies the cell placement restriction rule by positioning the first cell and the second cell in a relative manner that satisfies the offset requirement.

12. The system of claim 11, wherein the offset requirement specifies one or more acceptable amounts of common run between the first type of logic cell and the second type of logic cell when the first type of logic cell and the second type of logic cell are positioned within a predetermined proximity of one another within the semiconductor layout.

13. The system of claim 12, wherein the cell placement restriction rule further specifies one or more of a voltage supply rail, cell edge or position associated with the offset requirement.

14. The system of claim 13, wherein determining that the initial position of the second cell violates the cell placement restriction rule comprises determining that the second cell has been placed on the voltage supply rail specified by the cell placement restriction rule.

15. The system of claim 11, wherein the offset requirement defines a minimum amount of overlap between boundaries of the first cell and the second cell and repositioning the first cell or the second cell to a modified position comprises repositioning the second cell to increase an amount of overlap between the boundaries of the first cell and the second cell.

16. The system of claim 15, wherein the minimum amount of overlap comprises a specified number of pitches.

17. A computer program product comprising a computer readable storage medium having program instructions embodied therewith, the program instructions executable by a computer processor to cause the computer processor to perform a method comprising:
determining a cell placement restriction rule for a first type of logic cell that specifies relative placement rules for one or more other cell types placed within a predetermined proximity to the first type of logic cell, the predetermined proximity comprising a number of pitches, the cell placement restriction rule comprising an offset requirement between the first type of logic cell and a second type of logic cell;
responsive to placing a first cell comprising the first type of logic cell within a semiconductor layout, tagging the first cell with the cell placement restriction rule for the first type of logic cell;
placing a second cell at an initial position within the semiconductor layout, wherein the second cell comprises the second type of logic cell;
determining whether any portion of the second cell is within the predetermined proximity of the first cell by considering an area around the first cell that is extended both horizontally and vertically by the predetermined number of pitches;
responsive to determining that a portion of the second cell is within the predetermined proximity, applying the cell placement restriction rule to the second cell; and
responsive to determining that the initial position of the second cell violates the cell placement restriction rule, repositioning the first cell or the second cell to a modified position within the semiconductor layout, wherein the modified position satisfies the cell placement restriction rule by positioning the first cell and the second cell in a relative manner that satisfies the offset requirement.

18. The computer program product of claim 17, wherein the offset requirement specifies one or more acceptable amounts of common run between the first type of logic cell and the second type of logic cell when the first type of logic cell and the second type of logic cell are positioned within a predetermined proximity of one another within the semiconductor layout.

19. The computer program product of claim 18, wherein the cell placement restriction rule further specifies one or more of a voltage supply rail, cell edge or position associated with the offset requirement.

20. The computer program product of claim 19, wherein determining that the initial position of the second cell violates the cell placement restriction rule comprises determining that the second cell has been placed on the voltage supply rail specified by the cell placement restriction rule.

* * * * *